United States Patent
Matsuda et al.

(10) Patent No.: US 7,741,931 B2
(45) Date of Patent: Jun. 22, 2010

(54) ACOUSTIC WAVE DEVICE, RESONATOR AND FILTER

(75) Inventors: Satoru Matsuda, Kawasaki (JP); Michio Miura, Kawasaki (JP); Shogo Inoue, Kawasaki (JP); Takashi Matsuda, Kawasaki (JP); Masanori Ueda, Kawasaki (JP); Seiichi Mitobe, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 132 days.

(21) Appl. No.: 11/902,800

(22) Filed: Sep. 25, 2007

(65) Prior Publication Data

US 2008/0074212 A1 Mar. 27, 2008

(30) Foreign Application Priority Data

Sep. 25, 2006 (JP) ............................. 2006-258956

(51) Int. Cl.
*H03H 9/72* (2006.01)
*H03H 9/64* (2006.01)

(52) U.S. Cl. ...................... 333/133; 333/193; 333/195; 310/312; 310/313 B (58) Field of Classification Search ................ 333/133, 333/193–196; 310/312, 313 R, 313 B, 313 C, 310/313 D
See application file for complete search history.

(56) References Cited

U.S. PATENT DOCUMENTS

| 5,654,680 | A | * | 8/1997 | Kwan et al. ................. 333/195 |
| 5,726,610 | A | * | 3/1998 | Allen et al. .................. 333/133 |
| 5,770,985 | A | * | 6/1998 | Ushiroku et al. ............ 333/193 |
| 6,516,503 | B1 | | 2/2003 | Ikada et al. |
| 6,710,514 | B2 | * | 3/2004 | Ikada et al. ............. 310/313 C |
| 6,744,333 | B2 | * | 6/2004 | Sawada ...................... 333/133 |
| 2002/0190815 | A1 | | 12/2002 | Takamine |
| 2007/0152774 | A1 | * | 7/2007 | Nakanishi et al. ........... 333/133 |

FOREIGN PATENT DOCUMENTS

| JP | 2000-068784 | * | 3/2000 |
| JP | 2000-196409 | * | 7/2000 |
| JP | 2003-209458 A | | 7/2003 |
| KR | 1020010029728 A | | 4/2001 |
| KR | 1020020093592 A | | 12/2002 |
| WO | WO 2005/076473 | * | 8/2005 |

OTHER PUBLICATIONS

Machine Translation of JP 2000-068784, Inose et al., Mar. 2000.*
Machine Translation of JP 2000-196409, Funemi et al., Jul. 2000.*

* cited by examiner

*Primary Examiner*—Barbara Summons (57) ABSTRACT

A filter includes a parallel resonator having first comb electrodes provided on a piezoelectric substrate and a first dielectric film that covers the first comb electrodes, and a series resonator having second comb electrodes provided on the piezoelectric substrate and a second dielectric film covers the second comb electrodes and is made of a material identical to that of the first dielectric film. The first dielectric film has a different thickness from that of the second dielectric film.

15 Claims, 13 Drawing Sheets

ACOUSTIC WAVE DEVICE, RESONATOR AND FILTER

BACKGROUND OF THE INVENTION

1. Field of the Invention

The present invention relates to filters and duplexers, and more particularly, to a filter using an acoustic wave device and a duplexer using the same.

2. Description of the Related Art

Recently, a bandpass filter using an acoustic wave device has been used in high-frequency radio equipment such as a cellular phone. Recent advance of performance of cellular phones requires reduction of the absolute value of a temperature coefficient of frequency (frequently abbreviated as TCF). TCF is a rate of change of the frequency response to a variation in the environment temperature. In the resonators, a change of the resonance frequency to a variation in the environment temperature equal to 1° C. is expressed in the unit of ppm/° C. TCF almost depends on the temperature coefficient of velocity of SAW propagated on the surface of the piezoelectric substrate. The TCF of the SAW device is as bad as −80~−40 ppm/° C. for a piezoelectric substrate of lithium niobate ($LiNbO_3$) or lithium tantalate ($LiTaO_3$), and is thus required to be improved.

Japanese Patent Application Publication No. 2003-209458 discloses an acoustic wave device in which comb electrodes on a substrate of lithium niobate are coated with a silicon oxide film. The acoustic wave is propagated in not only the lithium niobate substrate but also in the silicon oxide film. The temperature coefficient of the propagation velocity of the acoustic wave in the silicon oxide film has a sign opposite to that of the temperature coefficient of the propagation velocity of the acoustic wave in the lithium niobate substrate. It is thus possible to keep the total propagation velocity of the propagation velocity constant irrespective of temperature by optimizing the thickness of the silicon oxide film. That is, TCF can be reduced by optimally selecting the thickness of the silicon oxide film.

Figure 1:
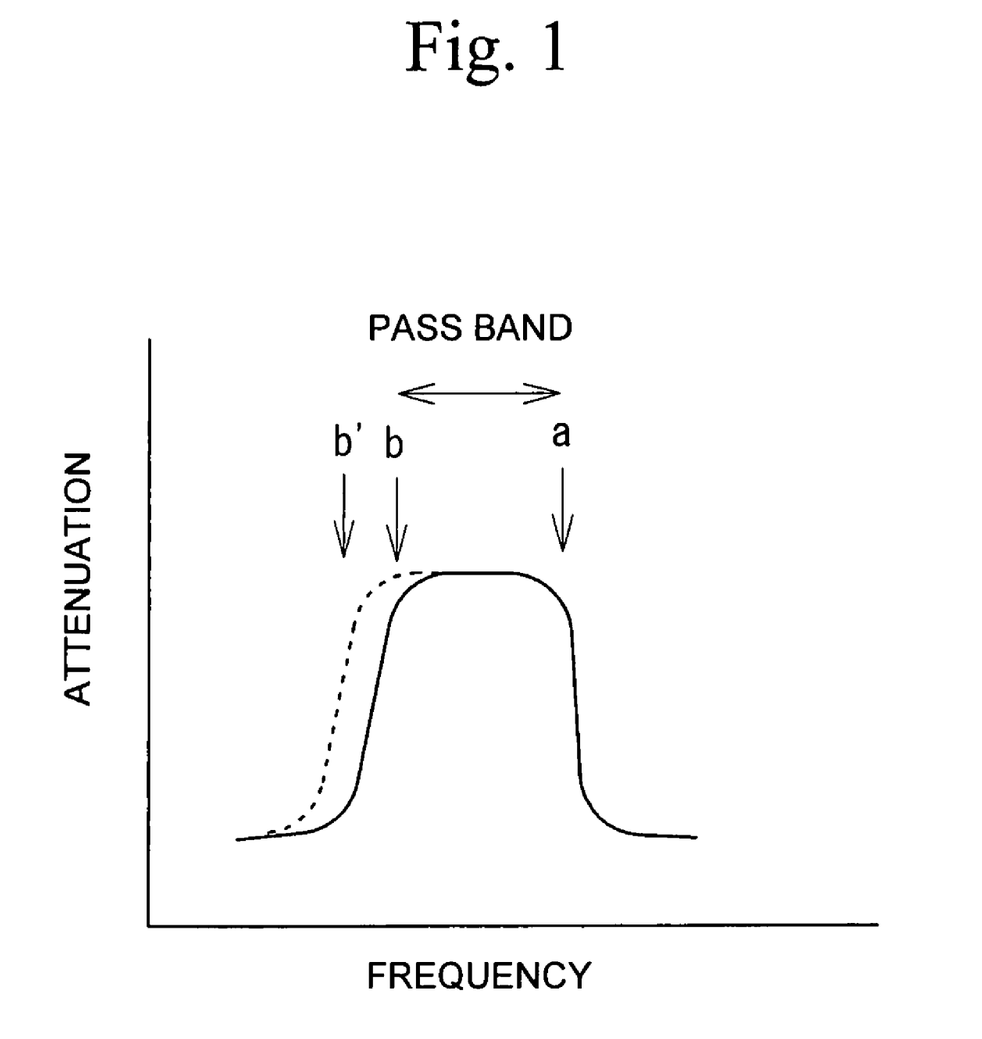
FIG. 1 is a graph of a bandpass characteristic of a filter.

FIG. 1 is a graph of a bandpass characteristic of a bandpass filter. By using the technique disclosed in the above-mentioned application, The TCF of a shoulder a on the high-frequency side of the pass band can be reduced to approximately zero. However, a shoulder b on the low-frequency side of the pass band is not improved well. For example, when the temperature raises, the shoulder b shifts to b'.

SUMMARY OF THE INVENTION

The present invention has been made in view of the above circumstances, and provides an improved filter and a duplexer having reduced TCF.

According to an aspect of the present invention, there is provided a filter including: a parallel resonator having first comb electrodes provided on a piezoelectric substrate and a first dielectric film that covers the first comb electrodes; and a series resonator having second comb electrodes provided on the piezoelectric substrate and a second dielectric film covers the second comb electrodes and is made of a material identical to that of the first dielectric film, the first dielectric film having a different thickness from that of the second dielectric film.

According to another aspect of the present invention, there is provided a filter equipped with the above-mentioned parallel and series resonators.

According to yet another aspect of the present invention, there is provided a duplexer equipped with the above-mentioned parallel and series resonators.

BRIEF DESCRIPTION OF THE DRAWINGS

Preferred embodiments of the present invention will be described with reference to the following figures, in which.

DESCRIPTION OF THE PREFERRED EMBODIMENTS

A description will now be given of embodiments of the present invention with reference to the accompanying drawings.

Figure 2A:
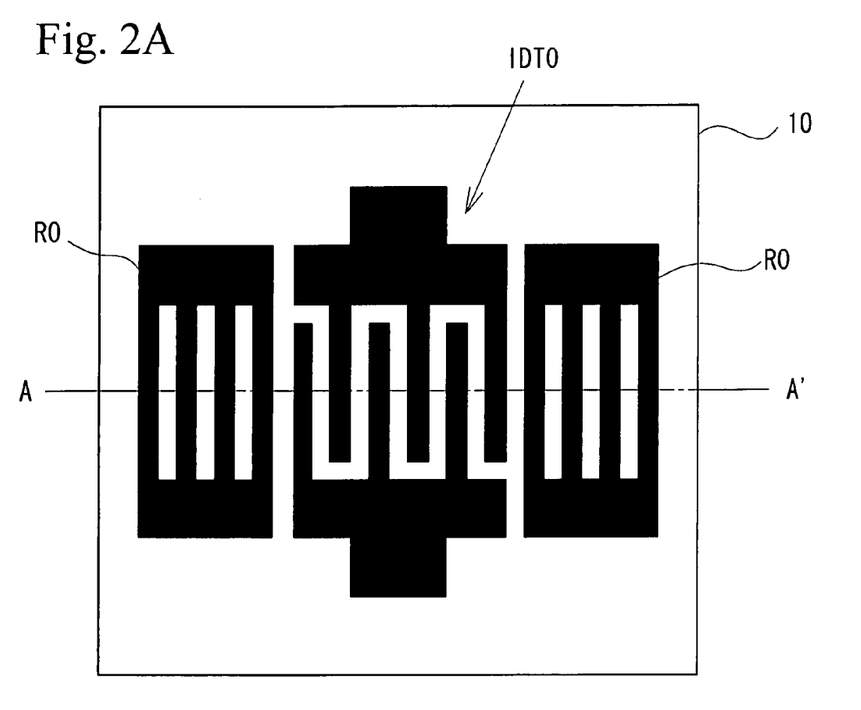
FIG. 2A is a plan view of a resonator using a boundary acoustic wave.
Figure 2B:
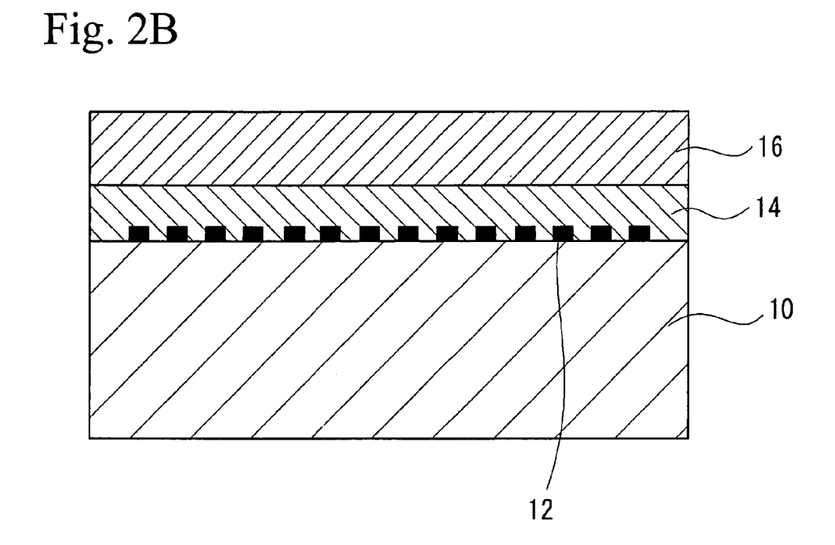
FIG. 2B is a cross-sectional view taken along a line A-A'.

First, the principles of the invention are described. FIG. 2A is a plan view of a resonator used in an experiment, and FIG. 2B is a cross-sectional view taken along a line A-A' shown in FIG. 2A. A lot of electrode fingers are omitted for the sake of simplicity. A piezoelectric substrate 10 is a 30° Y-cut X-propagation lithium niobate substrate. Electrodes 12 made of, for example, copper, are formed on the piezoelectric substrate 10. The electrodes 12 include a pair of comb electrodes that form an interdigital transducer IDT0, and grating electrodes that form a pair of reflectors R0. A first dielectric film 14, which may be made of, for example, silicon oxide, is formed so as to cover the electrodes 12. A third dielectric film 16, which may be made of, for example, aluminum oxide, is provided on the first dielectric film 14. The comb electrode pair IDT0 is interposed between the reflectors R0. When a high-frequency signal is applied to one of the pair IDT0 of comb electrodes, acoustic boundary waves are excited in the surface of the piezoelectric substrate 10 and in the first dielectric film 14. The acoustic boundary waves resonate at a frequency determined by a period λ of the comb electrodes and the propagation velocity of the acoustic boundary waves. A high-frequency signal of the resonance frequency is excited at the other comb electrode of the pair IDT0. Thus, the resonator functions as a filter. The third dielectric film 16 is made of a material having a greater acoustic velocity than that of the material of the first dielectric film 14, so that the acoustic boundary waves can be confined in the surface of the piezoelectric substrate 10 and the first dielectric film 14.

Figure 3:
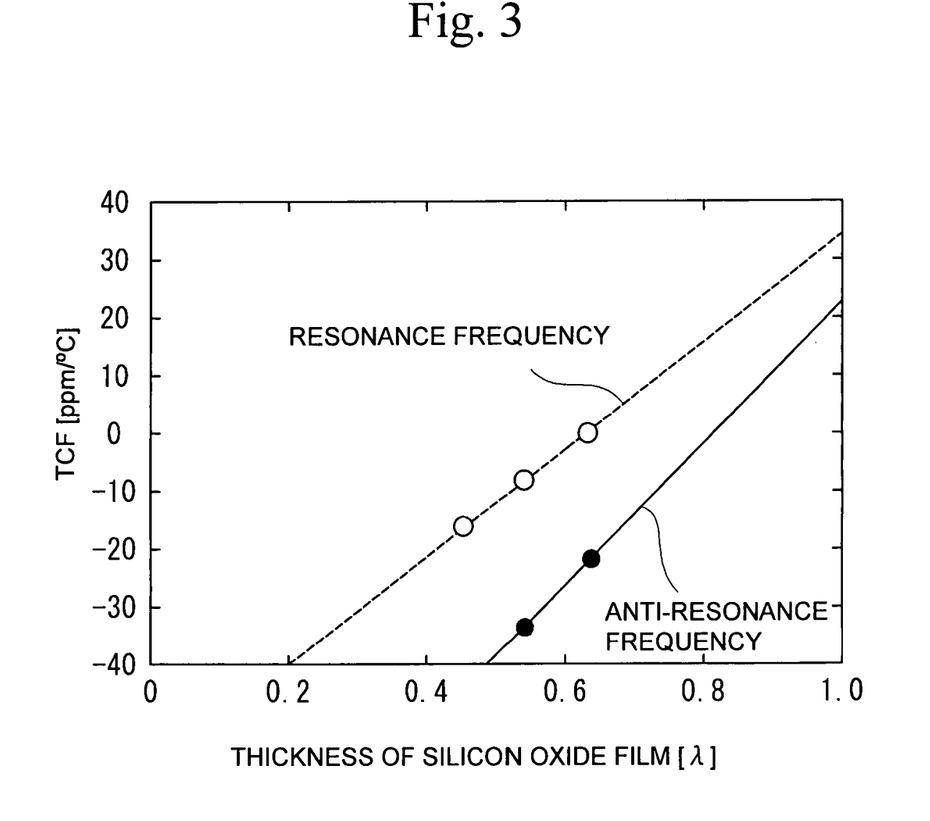
FIG. 3 shows TCF of the resonance frequency and that of the anti-resonance frequency when a piezoelectric substrate made of lithium niobate is used.

FIG. 3 is graph of TCF (ppm/° C.) of the resonance frequency and that of the anti-resonance frequency as a function of the thickness of the silicon oxide film (λ). In FIG. 3, circles "○" and "●" are the results of measurement, and solid and broken lines are approximate lines. The aluminum oxide film is 2 μm thick.

The resonance frequency and the anti-resonance frequency have a different relationship in TCF as a function of the thickness of the silicon oxide film. The TCF of the anti-resonance frequency is approximately zero when the silicon oxide film is approximately 0.8λ thick. The TCF of the resonance frequency is approximately zero when the silicon oxide film is approximately 0.6λ thick. The thickness of the silicon oxide film with TCF being zero at the anti-resonance frequency is different from that of the silicon oxide film with TCF being zero at the resonance frequency. Thus, the oxide silicon film cannot simultaneously make TCF of the resonance frequency and that of the anti-resonance frequency equal to zero. For example, a ladder type filter is designed so that the anti-resonance frequency of a series resonator forms an attenuation pole on the high-frequency side of a pass band, and the resonance frequency of a parallel resonator forms an attenuation pole on the low-frequency side of the pass band. Thus, even when TCF of the shoulder a on the high-frequency side of the pass band shown in FIG. 1 is set approximately equal to zero, TCF of the shoulder b of the low-frequency side of the pass band is not improved sufficiently.

The TCF of the acoustic boundary wave results from temperature variations of the electromechanical coupling coefficients and the dielectric constants of the piezoelectric substrate 10 and the first dielectric film 14. The temperature variations at the resonance frequency and the anti-resonance frequency affect TCF differently. Thus, TCF of the resonance frequency is different from that of the anti-resonance frequency.

According to an aspect of the present invention, the first dielectric film 14 of an acoustic wave device using an anti-resonance point as an attenuation pole has a thickness different from that of the first dielectric film 14 of another acoustic wave device using a resonance point as an attenuation pole. It is thus possible to simultaneously improve TCF of the attenuation pole defined by the anti-resonance point and that of the attenuation pole defined by the resonance point.

First Embodiment

Figure 4:
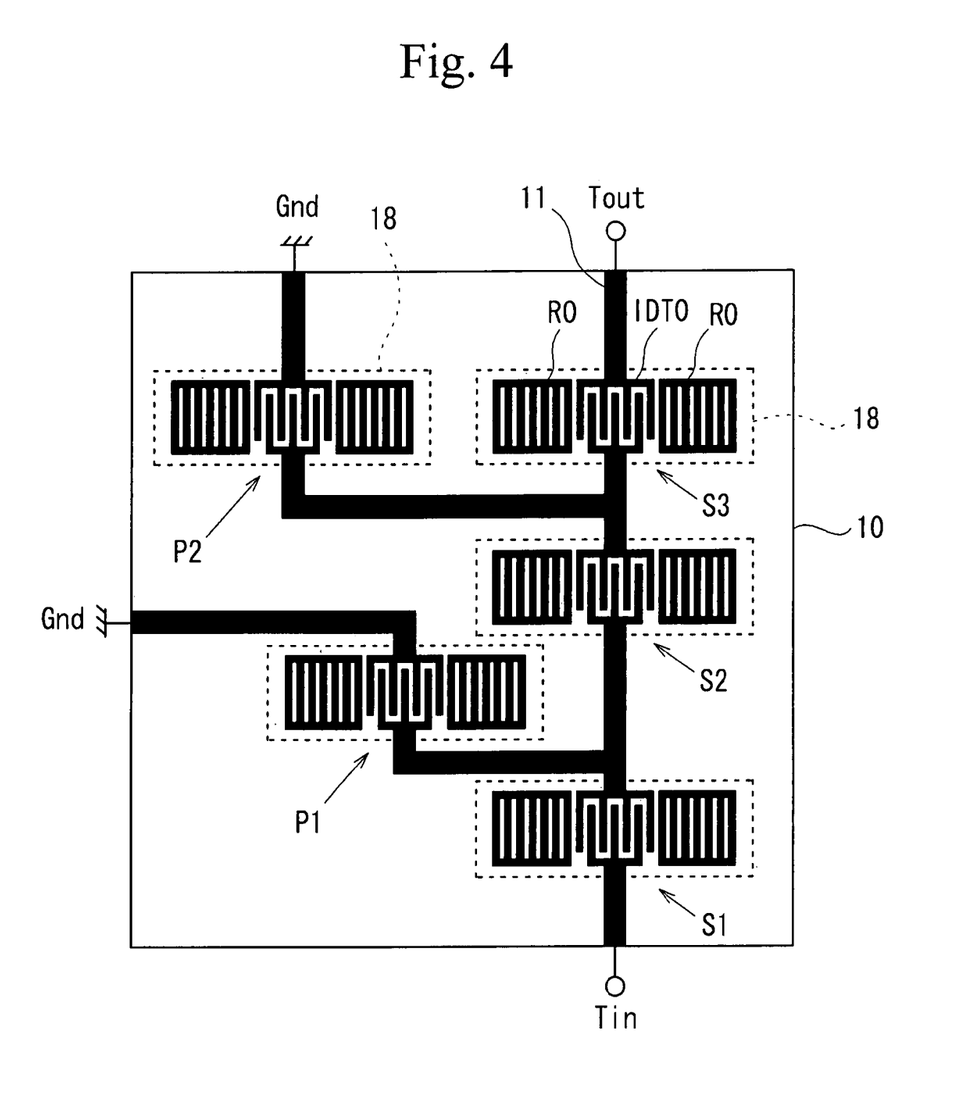
FIG. 4 is a plan view of a filter in accordance with a first comparative example.

A first embodiment of the present invention is a ladder filter having a 1.9 GHz band. FIG. 4 is a schematic plan view of a ladder filter in accordance with a first comparative example. Referring to FIG. 4, solid lines indicate the electrodes 12 and interconnection lines 11 connecting the resonators formed on the piezoelectric substrate 10. Series resonators S1 through S3 are connected in series between an input terminal Tin and an output terminal Tout. A parallel resonator P1 is connected between a node connecting the series resonators S1 and S2 and ground. A parallel resonator P2 is connected between a node connecting the series resonators S2 and S3 and ground. Each of the series resonators S1 through S3 and the parallel resonators P1 and P2 is a one-port resonator. A dielectric laminate film 18 is provided to each of the series resonators S1 through S3 and the parallel resonators P1 and P2. The electrodes 12 are illustrated to see through the dielectric laminate films 18.

Figure 5:
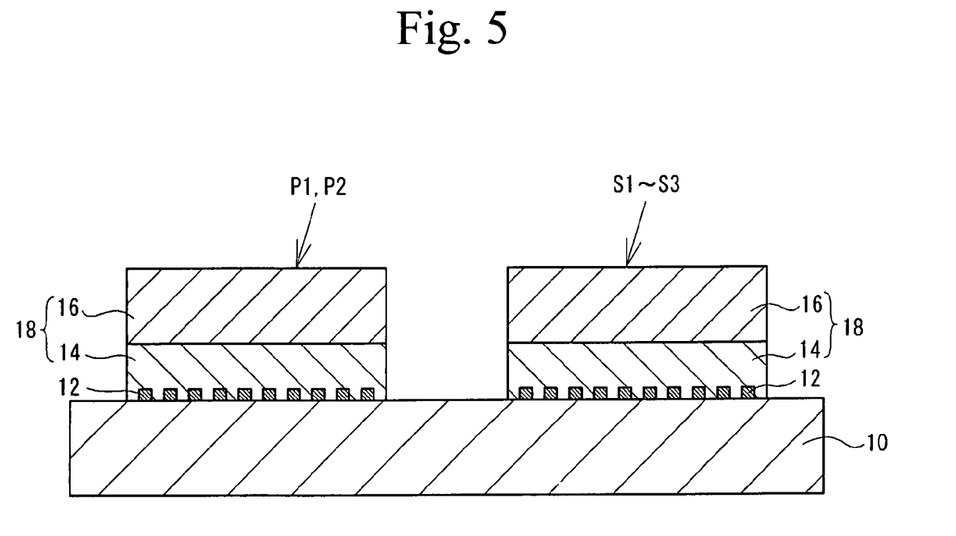
FIG. 5 is a cross-sectional view of the filter of the first comparative example.

FIG. 5 is a cross-sectional view of the first comparative example in which one of the series resonators S1-S3 and one of the parallel resonators P1 and P2 are illustrated. The electrodes 12 having a thickness of 180 nm and a major component of copper are provided on the piezoelectric substrate 10 made of 30° Y-cut X-propagation lithium niobate. The electrodes 12 have a period λ of 2 μm has a finger width of 0.5 μm. The first dielectric film 14, which may be made of silicon oxide and may be 1.26 μm thick, is provided so as to cover the electrodes 12. The third dielectric film 16, which is made of aluminum oxide and is 2 μm thick, is provided on the first dielectric film 14. The first dielectric film 14 and the third dielectric film 16 form the dielectric laminate film 18.

Figure 6:
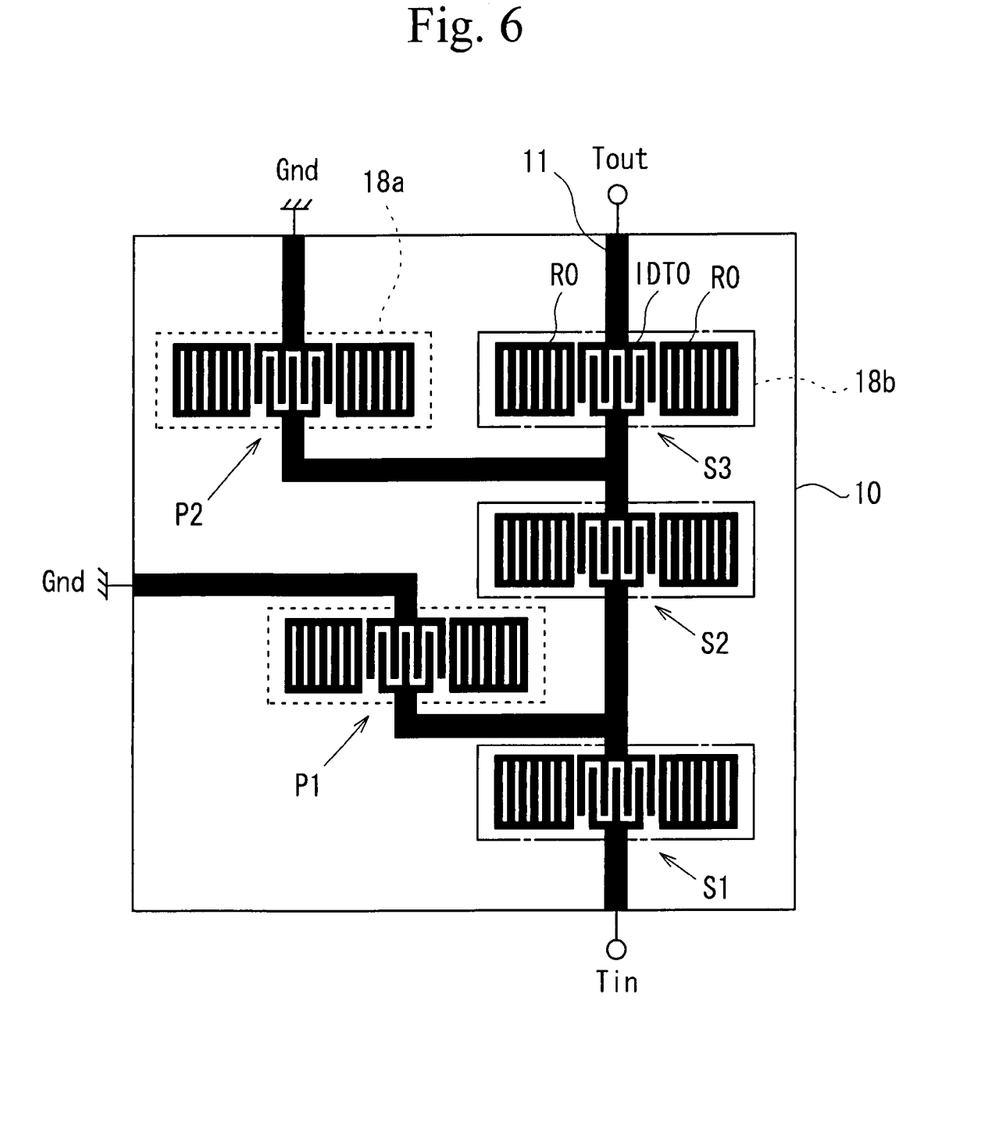
FIG. 6 is a plan view of a filter in accordance with a first embodiment.

FIG. 6 is a plan view of the ladder filter in accordance with the first embodiment. As compared to the first comparative example shown in FIG. 4, a dielectric laminate film 18a is provided for the parallel resonators P1 and P2, and another dielectric laminate film 18b is provided for the series resonators S1 through S3. In the parallel resonators P1 and P2, electrodes 12a are covered with a first dielectric film 14a, which may be made of silicon oxide and may be 1.26 μm thick. The first dielectric film 14a and the third dielectric film provided thereon form the dielectric laminate film 18a. In the series resonators S1 through S3, electrodes 12b are covered with a second dielectric film 14b, which is made of silicon oxide and is 1.6 μm thick. The second dielectric film 14b is 0.34 μm thicker than the first dielectric film 14a. The height difference between the first dielectric film 14a and the second dielectric film 14b is denoted as h1 in FIG. 7. The second dielectric film 14b and the third dielectric film 16 form the dielectric laminate film 18b. The other structures of the first embodiment are the same as those of the first comparative example.

In the first comparative example, the first dielectric film is uniform for the series resonators S1 through S3 and for the parallel resonators P1 and P2. Thus, from FIG. 3, there is a difference equal to approximately 20 ppm between TCF of the anti-resonance frequency of the series resonators S1 through S3 and that that of the resonance frequency of the parallel resonators P1 and P2. Thus, even when TCF of the shoulder of the low-frequency side of the pass band (which corresponds to the resonance frequency of the parallel resonators) is set approximately equal to zero, TCF of the shoulder of the high-frequency side thereof (which corresponds to the anti-resonance frequency of the series resonators) is approximately equal to −20 ppm/° C.

In the first embodiment, the second dielectric film 14b of the series resonators S1 through S3 is thicker than the first dielectric film 14a of the parallel resonators P1 and P2. Thus, it is possible to set TCF of the resonance frequency of the parallel resonator P1 and P2 and TCF of the anti-resonance frequency of the series resonators S1 through S3 approximately equal to zero.

The parallel resonators P1 and P2 of the ladder filter in accordance with the first embodiment has the electrodes 12a (first comb electrodes) provided on the piezoelectric substrate 10 and the first dielectric film 14a provided so as to cover the electrodes 12a. Further, the series resonators S1 through S3 has the electrodes 12b (second comb electrodes) provided on the piezoelectric substrate 10 and the second dielectric film 14b that is made of the same material as that of the first dielectric film 14a but is different in thickness from the first dielectric film 14a so as to cover the electrodes 12b. Thus, the both shoulders of the pass band may have an identical TCF by approximately selecting the thickness of the first dielectric film 14a and that of the second dielectric film 14b.

An arrangement will now be considered in which the piezoelectric substrate 10 is made of lithium niobate and the first and second dielectric films 14a and 14b are made of silicon oxide. Referring to FIG. 3, when the first and second dielectric films 14a and 14b have an identical thickness and TCF of the anti-resonance frequency is set approximately equal to zero, TCF of the resonance frequency is approximately equal to 20 ppm/° C. When the absolute value of TCF of the resonance frequency is attempted to be reduced to half the above value, namely, 10 ppm/° C. or less, the thickness of the silicon oxide film should be reduced to by 0.1λ to 0.3λ. That is, preferably, the difference in thickness between the first dielectric film 14a and the second dielectric film 14b are different from each other by 0.1λ to 0.3λ.

Second Embodiment

Figure 7:
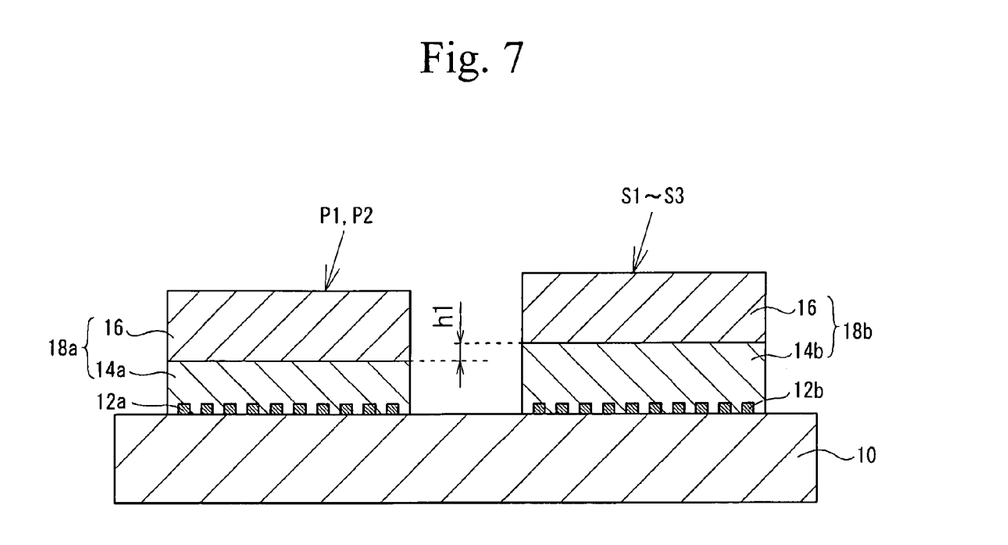
FIG. 7 is a cross-sectional view of the filter of the first embodiment.
Figure 8:
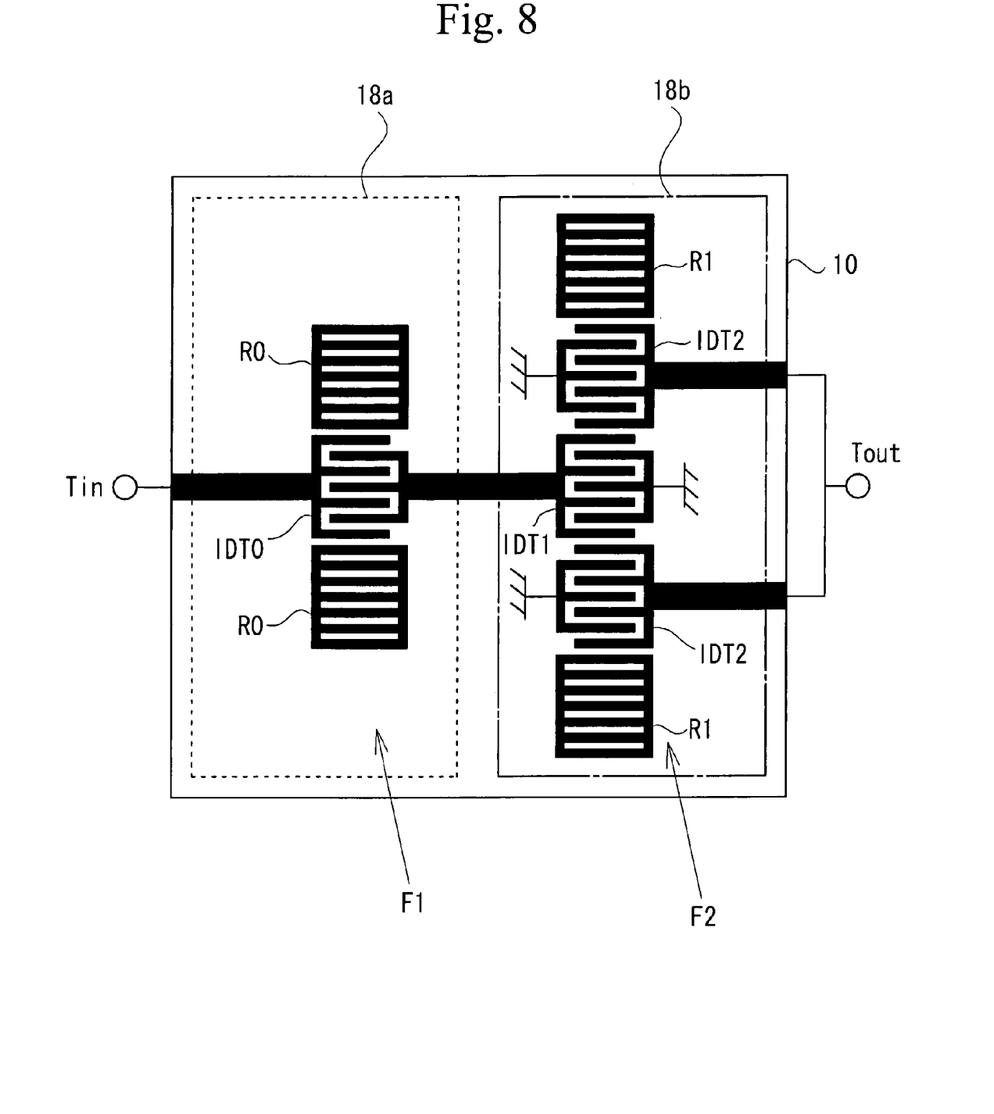
FIG. 8 is a plan view of a filter in accordance with a second embodiment.

A second embodiment is a filter in which a one-port resonator and a multimode filter are connected in series. FIG. 8 is a plan view of the filter of the second embodiment. A cross section of a first acoustic wave filter F1 is the same as that of the parallel resonator of the first embodiment shown in FIG. 7, and a cross section of a second acoustic wave filter F2 is the same as that of the series resonator of the first embodiment shown in FIG. 7. Therefore, FIG. 7 will be referred to in the following description of the second embodiment. Referring to FIG. 8, the first acoustic wave filter F1 and the second acoustic wave filter F2 are connected in series between an input terminal Tin and an output terminal Tout. The first acoustic wave filter F1 is a one-port resonator having a pair IDT0 of comb electrodes and a pair of reflectors R0 arranged at both sides of IDT0. The pair IDT0 of comb electrodes is connected to the input terminal Tin and an input IDT1 of the second acoustic wave filter F2. The first acoustic wave filter F1 is provided with the dielectric laminate film 18a composed of the first dielectric film 14a and the third dielectric film 16. The electrodes 12a of the first acoustic wave filter F1 have a thickness of 180 nm, a period of 2 μm, and a finger width of 0.5 μm. The first dielectric film 14a of the first filter F1 may be 1.26 μm thick, and the third dielectric film 16 thereof may be 2 μm thick.

The second acoustic wave filter F2 is a double-mode filter (DMS) having the input IDT1, two output IDT2 arranged at both sides of the input IDT1, and two reflectors R1 arranged further out than the two output IDT2. The input IDT1 is connected to IDT0 of the first acoustic wave filter F1, and the output IDT2 are connected to the output terminal Tout. The second acoustic wave filter F2 is provided with the dielectric laminate film 18b composed of the second dielectric film 14b and the third dielectric film 16. The electrodes 12b of the second acoustic wave filter F2 have a thickness of 180 nm, a period of 1.9 μm, and a finger width of 0.5 μm. The second dielectric film 14b of the second filter F2 is 1.6 μm thick, and the third dielectric film 16 thereof is 2 μm thick.

In the second embodiment, the resonance point of the first acoustic wave filter F1 forms an attenuation pole on the low-frequency side of the pass band, and the anti-resonance point of the second acoustic wave filter F2 forms an attenuation pole on the high-frequency side of the above pass band. Thus, as in the case of the first embodiment, it is possible to simultaneously improve TCF of both the shoulders of the pass band by appropriately selecting the thickness of the first dielectric film 14a and that of the second dielectric film 14b.

Third Embodiment

Figure 9:
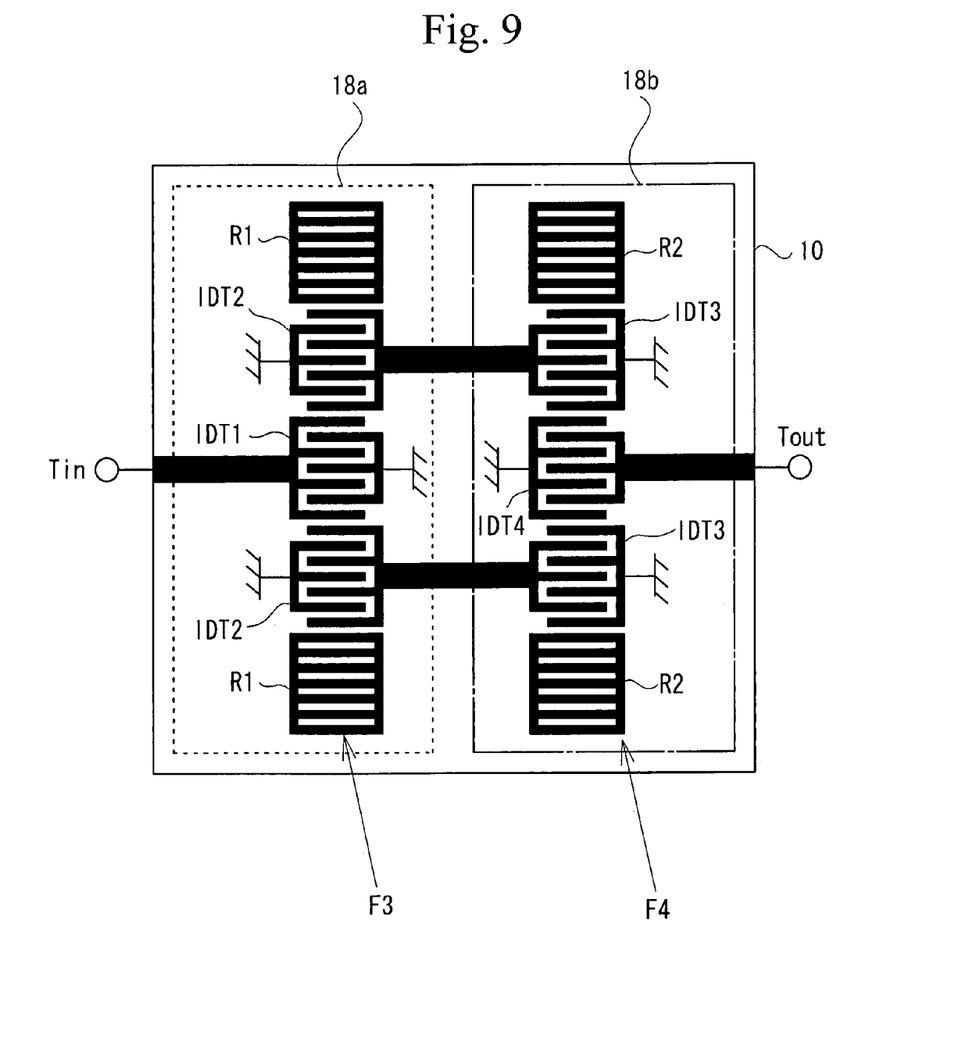
FIG. 9 is a plan view of a filter in accordance with a third embodiment.

A third embodiment is a filter in which multimode filters are connected in series, or are cascaded. FIG. 9 is a plan view of the filter of the third embodiment. The third embodiment has the same cross section as the second embodiment shown in FIG. 7, which will be sometimes referred to in the following description of the third embodiment. Referring to FIG. 9, a first acoustic wave filter F3 and a second acoustic wave filter F4 are connected in series between the input terminal Tin and the output terminal Tout. The first acoustic wave filter F3 is a double-mode filter having an input IDT1, two output IDT2 provided at both sides of the input IDT1, and two reflectors R1 provided further out than the two output IDT2. The input IDT1 is connected to the input terminal Tin, and the output terminal IDT2 is connected to the input IDT3 of the second acoustic wave filter F4. The first acoustic wave filter F3 is provided with the dielectric laminate film 18a composed of the first dielectric film 14a and the third dielectric film 16. The electrodes 12a of the first acoustic wave filter F3 have a thickness of 180 nm, a period of 2 μm and a finger width of 0.5 μm. The first dielectric film 14 may be 1.26 μm thick, and the third dielectric film 16 may be 2 μm thick.

The second acoustic wave filter F4 is a double-mode filter having an output IDT4, two input IDT3, and two reflectors R2 arranged further out than the two input IDT3. The two input IDT3 are connected to the two output IDT2 of the first acoustic wave filter F3, and the output IDT4 is connected to the output terminal Tout. The second acoustic wave filter F4 is provided with the dielectric laminate film 18b composed of the second dielectric film 14b and the third dielectric film 16. The electrodes 12b of the second acoustic wave filter F4 has a thickness of 180 nm, a period of 1.9 μm, and a finger width of 0.5 μm. The second dielectric film 14b is 1.6 μm thick, and the third dielectric film 16 is 2 μm thick.

In the third embodiment, the resonance point of the first acoustic wave filter F3 forms an attenuation pole on the low-frequency side of the pass band, and the anti-resonance point of the second acoustic wave filter F4 forms an attenuation pole on the high-frequency side of the above pass band. Thus, as in the case of the first embodiment, it is possible to simultaneously improve TCF of both the shoulders of the pass band by appropriately selecting the thickness of the first dielectric film 14a and that of the second dielectric film 14b.

As described above, in the second and third embodiments, the first dielectric film 14a and the second dielectric film 14b may be designed to have different thickness values in which the first dielectric film 14a covers the electrodes 12a (first comb electrodes) of the first acoustic wave filter F1 or F3 and the second dielectric film 14b covers the electrodes 12b (second comb electrodes) of the second acoustic wave filter F2 or F4. The resonance point of the first acoustic wave filter F1 or F3 forms an attenuation pole on the low-frequency side of the pass band, and the anti-resonance point of the second acoustic wave filter F2 or F4 form an attenuation pole on the high-frequency side of the pass band. Thus, as in the case of the first embodiment, it is possible to simultaneously improve TCF of both the shoulders of the pass band by appropriately selecting the thickness of the first dielectric film 14a and that of the second dielectric film 14b.

Fourth Embodiment

Figure 10:
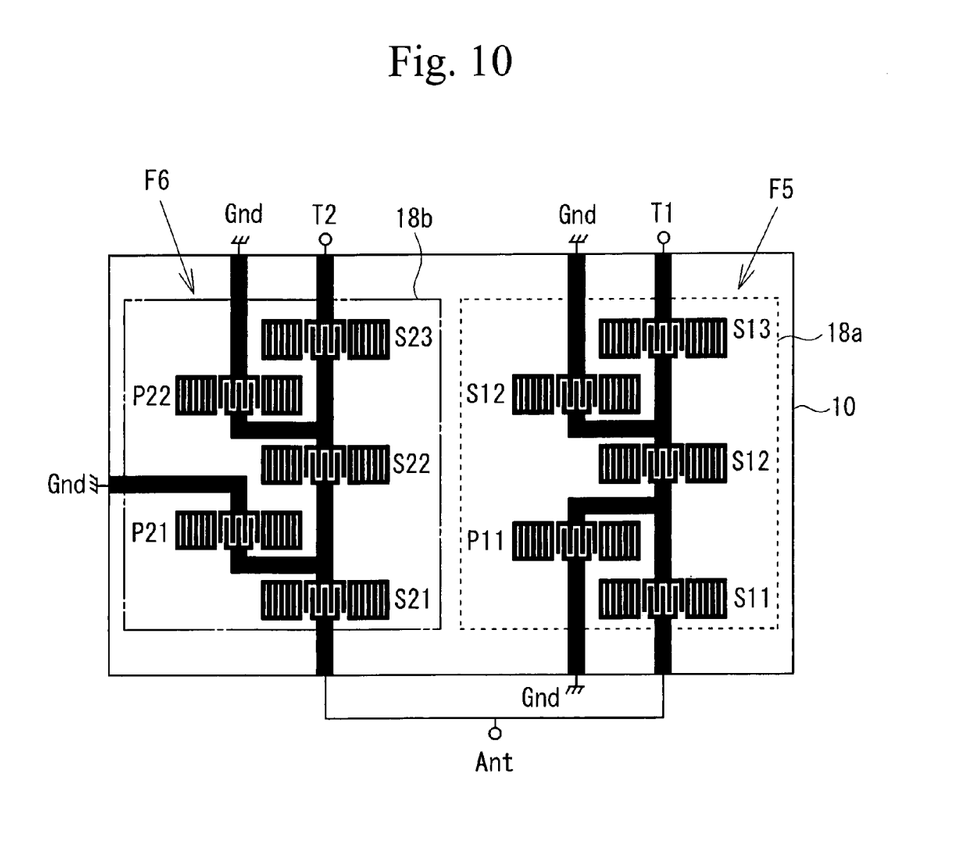
FIG. 10 is a plan view of a duplexer in accordance with a fourth embodiment.

A fourth embodiment is an exemplary duplexer. FIG. 10 is a plan view of the duplexer according to the fourth embodiment. The fourth embodiment has a first acoustic wave filter F5 and a second acoustic wave filter F6. The first acoustic wave filter F5 has the same cross section as the parallel resonator of the first embodiment shown in FIG. 7. Similarly, the second acoustic wave filter F6 has the same cross section as the series resonator of the first embodiment shown in FIG.

7, which will be sometimes referred to in the following description of the fourth embodiment. As shown in FIG. 10, the first acoustic wave filter F5 is provided between a common terminal Ant and a first terminal T1 and functions as a high-frequency-side filter. The second acoustic wave filter F6 is provided between the common terminal Ant and a second terminal T2 and functions as a low-frequency-side filter. A matching circuit (not shown) is provided between the common terminal Ant and at least one of the first and second filters F5 and F6.

The first acoustic wave filter F5 has series resonators S11 through S13 connected between the common terminal Ant and the first terminal T1, and parallel resonators P11 and P12 connected between nodes interposed between the adjacent series resonators and ground. The first acoustic wave filter F5 is provided with the first laminate film 18a composed of the first dielectric film 14a and the third dielectric film 16. The first dielectric film 14a may be 1.26 μm thick, and the third dielectric film 16 may be 2 μm thick.

The second acoustic wave filter F6 has series resonators S21 through S23 connected between the common terminal and the second terminal T2, and parallel resonators P21 and P22 connected between nodes interposed between the adjacent series nodes and ground. The second acoustic wave filter F6 is provided with the dielectric laminate film 18b composed of the second dielectric film 14b and the third dielectric film 16. The second dielectric film may be 1.6 μm thick, and the third dielectric film 16 may be 2 μm thick.

Figure 11:
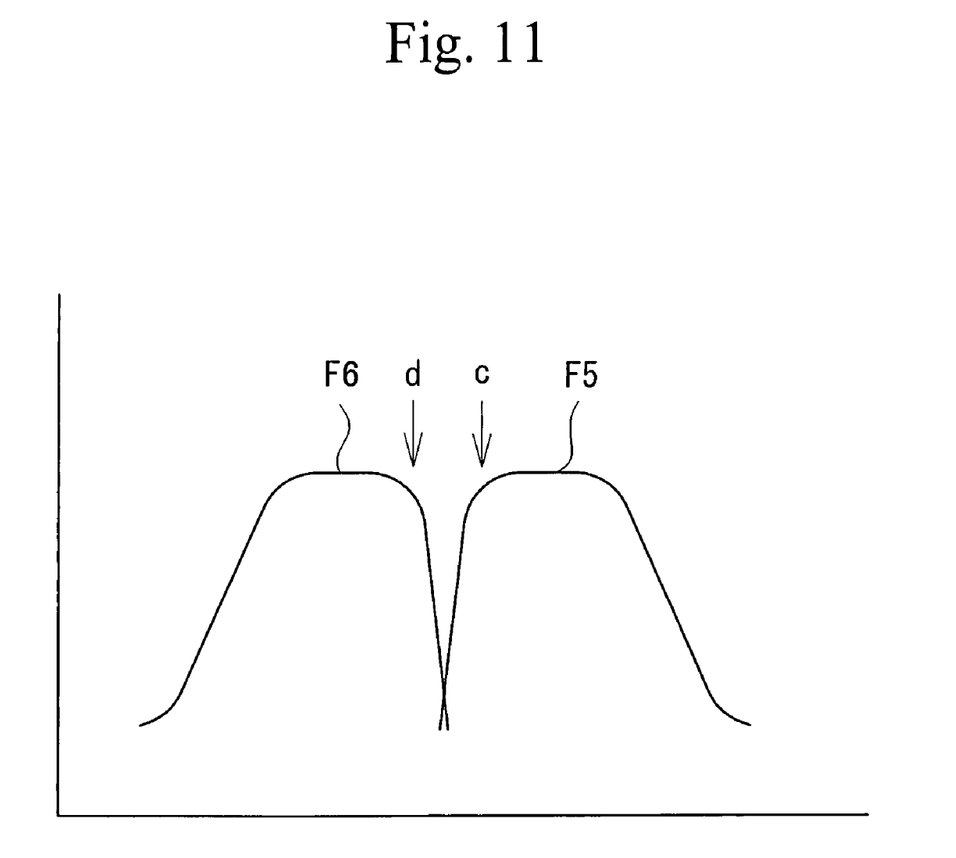
FIG. 11 is a graph of the bandpass characteristic of a duplexer.

FIG. 11 schematically shows a bandpass characteristic of the duplexer of the fourth embodiment. The first acoustic wave filter F5 and the second acoustic wave filter F6 have different center frequencies of the respective pass bands. The filters of the duplexer are required to have great attenuation in rejection bands. For example, the first acoustic wave filter F5 is required to have great attenuation in the pass band of the second acoustic wave filter F6. If TCF of the rejection band differs from that of the pass band of the other filter, the rejection band and the pass band of the other filter will deviate from the overlapping state, so that the other filter cannot be sufficiently suppressed in the pass band. Particularly, the shoulder c on the low-frequency side of the pass band of the first acoustic wave filter F5 and the shoulder d of the high-frequency side of the pass band of the second acoustic wave filter F6 have sharp changes of attenuation. Thus, if TCF of the shoulder c and that of the shoulder d are different from each other, suppression in the pass band of the other filter will be abruptly degraded. It is thus preferred that the shoulders c and d have TCF approximately equal to zero.

In the duplexer of the fourth embodiment, the first dielectric film 14a of the first acoustic wave filter F5 has a different thickness from that of the second dielectric film 14b of the second acoustic wave filter F6. It is thus possible to simultaneously improve TCF of the pass bands and rejection band of the filters F5 and F6 by appropriately selecting the thickness of the first dielectric film 14a and that of the second dielectric film 14b. Particularly, the second dielectric film 14b for the series resonators S21 to S23 of the second acoustic wave filter F6 is made thicker than the first dielectric film 14a for the parallel resonators P11 and P12 of the first acoustic wave filter F5. It is thus possible to set TCF of the shoulder c on the low-frequency side of the pass band of the first acoustic wave filter F5 and that of the shoulder d on the high-frequency side of the pass band of the second acoustic wave filter F6 approximately equal to zero. It is thus possible to restrain the pass band of one of the filters from being abruptly degraded by the other filter due to temperature change.

In the first through fourth embodiments, the third dielectric film 16 is provided on the first dielectric film 14a and the second dielectric film 14b, in which the third dielectric film 16 has an acoustic velocity greater than those of the first and second dielectric films 14a and 14b. It is thus possible to simultaneously improve the characteristics TCF of both the shoulders of the pass band of the acoustic wave filter in which the boundary acoustic waves are confined in the surface of the piezoelectric substrate 10 and the first dielectric film 14a or the second dielectric film 14b.

Figure 12:
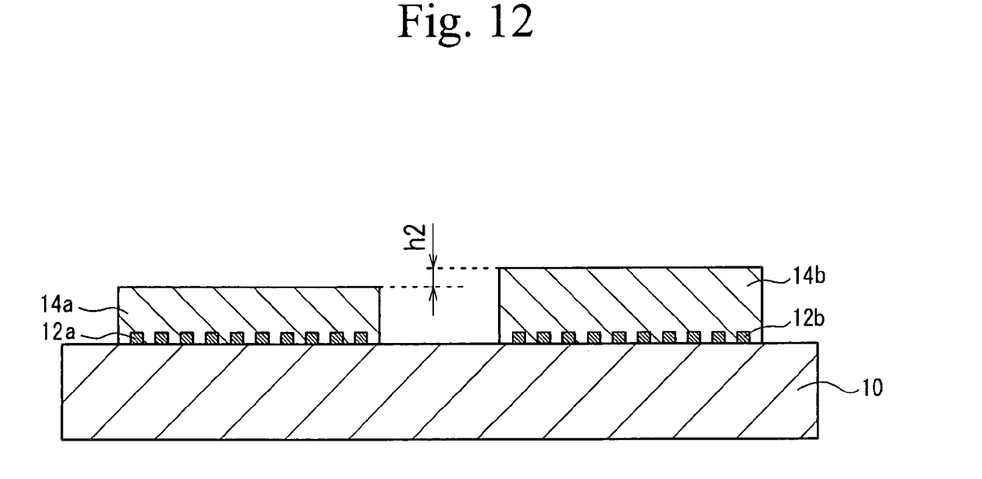
FIG. 12 is a cross-sectional view of an acoustic wave device using a Love wave.

The filters of the first through third embodiments and the duplexer of the fourth embodiment may be applied to another type of acoustic wave device that uses a Love wave as shown in FIG. 12. Referring to this figure, the dielectric film 14b is h2 thicker than the first dielectric film 14a. The device shown in FIG. 12 is not provided with the third dielectric film 16 used in the first embodiment as shown in FIG. 7. Even in the device shown in FIG. 12, the acoustic wave is propagated in the surface of the piezoelectric substrate 10 and the second dielectric film 14b. It is thus possible to simultaneously improve the TCF characteristics of both the shoulders of the pass band of the filter by causing the first dielectric film 14a and the second dielectric film 14b to have different thickness values, as in the case of the first through fourth embodiments.

Preferably, the first and second dielectric films 14a and 14b are made of silicon oxide, but are not limited thereto.

Figure 13:
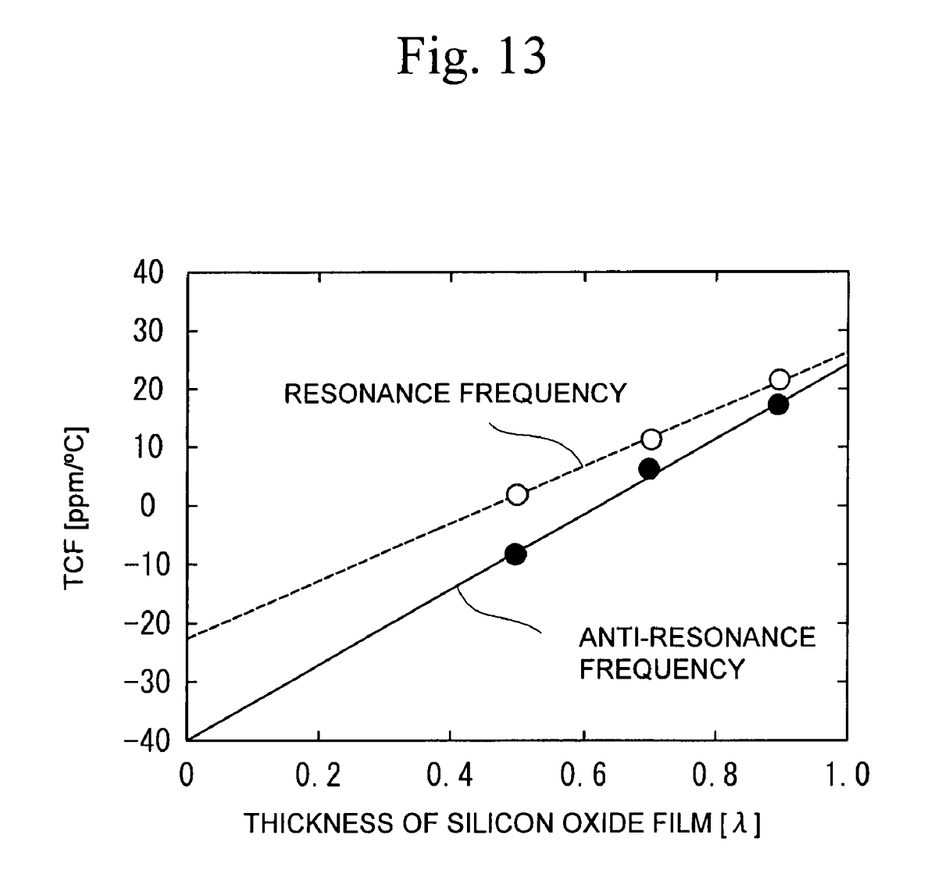
FIG. 13 shows TCF of the resonance frequency and that of the anti-resonance frequency when the piezoelectric film is made of lithium tantalate.

The piezoelectric substrate 10 may be made of lithium tantalate instead of lithium niobate. FIG. 13 shows TCF of the resonance frequency and that of the anti-resonance frequency with the piezoelectric substrate 10 being made of lithium tantalate as a function of the thickness of the silicon oxide film. As in the case of FIG. 3, the TCF of the resonance frequency as a function of the thickness of the silicon oxide film is different from that of the anti-resonance frequency. Thus, the first through fourth embodiments in which the first and second dielectric films 14a and 14b have different thickness values may be applied to the device with the piezoelectric substrate of lithium tantalate. It is thus possible to simultaneously improve the TCF characteristics of both the shoulders of the pass band. The acoustic waves are propagated in the surface of the piezoelectric substrate 10 and the first and second dielectric films 14a and 14b. Thus, the device with the piezoelectric substrate of lithium tantalate has similar effects to those of the first through fourth embodiments.

Preferably, the electrodes 12a and 12b are made of a material having a higher density than that of a material used to form the first dielectric film 14a and the second dielectric film 14b. The electrodes 12a and 12b are made of an element having a higher density than that of the first and second dielectric films 14a and 14b, the electrodes 12a and 12b may be capable of reflecting the acoustic waves very well. The electrodes 12a and 12b may be made thin. In this regard, the electrodes 12a and 12b are preferably made of copper.

The present invention is not limited to the specifically disclosed embodiments, but other embodiments and variations may be made without departing from the scope of the present invention.

The present application is based on Japanese Patent Application No. 2006-258956 filed on Sep. 25, 2006, the entire disclosure of which is hereby incorporated by reference.

What is claimed is:

1. A filter comprising:
   each of parallel resonators having first comb electrodes provided on a piezoelectric substrate and a first dielectric film that covers the first comb electrodes; and
   each of series resonators having second comb electrodes provided on the piezoelectric substrate and a second dielectric film that covers the second comb electrodes and is made of a material identical to that of the first dielectric film,
   each of the first dielectric films having a thickness smaller than a thickness of each of the second dielectric films.

2. The filter as claimed in claim 1, further comprising a third dielectric film that is provided on the first and second dielectric films,
   the third dielectric film having an acoustic velocity greater than acoustic velocities of the first and second dielectric films.

3. The filter as claimed in claim 1, wherein the first and second dielectric films comprise silicon oxide.

4. The filter as claimed in claim 1, wherein the piezoelectric substrate comprises one of lithium niobate and lithium tantalate.

5. The filter as claimed in claim 1, wherein the first and second comb electrodes comprise copper.

6. A filter comprising:
   a first acoustic wave filter having first comb electrodes provided on a piezoelectric substrate and a first dielectric film that covers the first comb electrodes; and
   a second acoustic wave filter having second comb electrodes provided on the piezoelectric substrate and a second dielectric film covers the second comb electrodes and is made of a material identical to that of the first dielectric film,
   the first dielectric film having a thickness smaller than a thickness of the second dielectric film,
   the first and second acoustic wave filters being connected in series;
   the first acoustic wave filter being an input side of the filter; and
   the second acoustic wave filter being an output side of the filter;
   wherein the first and second acoustic wave filter are respectively multimode acoustic wave filters.

7. A filter comprising:
   a filter acoustic wave filter having first comb electrodes provide on a piezoelectric substrate and a first dielectric film that covers the first comb electrodes; and
   a second acoustic wave filter having second comb electrode providing on the piezoelectric substrate and a second dielectric film covers the second comb electrodes and is made of a material identical to that of the first dielectric film,
   the first dielectric film having a thickness smaller than a thickness of the second dielectric film,
   the first and second acoustic wave filters being connected in series;
   the first acoustic wave filter being an input side of the filter;
   the second acoustic wave filter being an output side of the filter; and
   a third dielectric film that is provided on the first an second dielectric films,
   the third dielectric film having an acoustic velocity greater than acoustic velocities of the first and second dielectric films.

8. The filter as claimed in any one of claims 6 or 7, wherein the first and second dielectric films comprise silicon oxide.

9. The filter as claimed in any one of claims 6 or 7, wherein the piezoelectric substrate comprises one of lithium niobate and lithium tantalite.

10. The filter as claimed in any one of claims 6 or 7, wherein the first and second comb electrode comprise copper.

11. A duplexer comprising:
    a first acoustic wave filter having first comb electrodes provided on a piezoelectric substrate and a first dielectric film that covers the first comb electrodes; and
    a second acoustic wave filter having second comb electrode provided on the piezoelectric substrate and a second dielectric film covers the second comb electrodes and is made of a material identical to that of the first dielectric film,
    the first dielectric film having a thickness smaller than a thickness of the second dielectric film,
    the first and second acoustic wave filters being connected at a common terminal;
    the first acoustic wave filter being a high-frequency-side filter of the duplexer;
    the second acoustic wave filter being a low frequency-side filter of the duplexer; and
    the first and second acoustic wave filters being ladder filters.

12. The duplexer as claimed in claim 11, further comprises a third dielectric film that is provided on the first and second dielectric films,
    the third dielectric film having an acoustic velocity greater than acoustic velocity of the first and second dielectric films.

13. The duplexer as claimed in claim 11, wherein the first second dielectric films comprise silicon oxide.

14. The duplexer as claimed in claim 11, wherein the piezoelectric substrate comprises one of lithium niobate and lithium tantalate.

15. The duplexer as claimed in claim 11, wherein the first and second comb electrodes comprise copper.

* * * * *